United States Patent
Kobori et al.

(10) Patent No.: US 11,239,187 B2
(45) Date of Patent: Feb. 1, 2022

(54) SEMICONDUCTOR DEVICE

(71) Applicant: Murata Manufacturing Co., Ltd., Kyoto (JP)

(72) Inventors: Tsutomu Kobori, Kyoto (JP); Hiroshi Okabe, Kyoto (JP); Shigeru Yoshida, Kyoto (JP); Shingo Yanagihara, Kyoto (JP); Yoshifumi Takahashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 22 days.

(21) Appl. No.: 16/925,006

(22) Filed: Jul. 9, 2020

(65) Prior Publication Data

US 2021/0013164 A1 Jan. 14, 2021

(30) Foreign Application Priority Data

Jul. 11, 2019 (JP) .............................. JP2019-129539

(51) Int. Cl.

| | |
|---|---|
| *H01L 23/64* | (2006.01) |
| *H01L 27/06* | (2006.01) |
| *H01L 23/66* | (2006.01) |
| *H01L 29/10* | (2006.01) |
| *H01L 29/737* | (2006.01) |
| *H01L 49/02* | (2006.01) |

(52) U.S. Cl.
CPC .............. *H01L 23/66* (2013.01); *H01L 23/64* (2013.01); *H01L 27/0641* (2013.01); *H01L 28/10* (2013.01); *H01L 29/7371* (2013.01); *H01L 2223/6655* (2013.01)

(58) Field of Classification Search
CPC ..... H01L 23/64; H01L 23/66; H01L 27/0641; H01L 28/10; H01L 29/7371
USPC ..................................................... 257/183, 197
See application file for complete search history.

(56) References Cited

U.S. PATENT DOCUMENTS

| | | | |
|---|---|---|---|
| 7,511,575 B2 | 3/2009 | Gotou et al. | |
| 2006/0176117 A1* | 8/2006 | Kawashima | ............ H03F 3/189 |
| | | | 330/302 |
| 2007/0205432 A1* | 9/2007 | Tsukao | ................ H01L 29/7371 |
| | | | 257/183 |
| 2015/0035607 A1 | 2/2015 | Takenaka et al. | |
| 2016/0258418 A1* | 9/2016 | Kudsk | ..................... F03D 15/10 |
| 2019/0190464 A1* | 6/2019 | Peyrot | ..................... H01L 24/48 |

FOREIGN PATENT DOCUMENTS

JP  2015-46858 A  3/2015

* cited by examiner

*Primary Examiner* — David Vu
*Assistant Examiner* — Brandon C Fox
(74) *Attorney, Agent, or Firm* — Pearne & Gordon LLP (57) ABSTRACT

A ground pad is disposed on a substrate. A plurality of transistors, each grounded at an emitter thereof, are in a first direction on a surface of the substrate. An input line connected to bases of the transistors is on the substrate. At least two shunt inductors are each connected at one end thereof to the input line and connected at the other end thereof to the ground pad. In the first direction, the two shunt inductors are on opposite sides of a center of a region where the transistors are arranged.

20 Claims, 9 Drawing Sheets

SEMICONDUCTOR DEVICE

This application claims priority from Japanese Patent Application No. 2019-129539 filed on Jul. 11, 2019. The content of this application is incorporated herein by reference in its entirety.

BACKGROUND

The present disclosure relates to a semiconductor device. An impedance matching circuit is interposed between stages of a radio frequency power amplifier including multiple stages (see, e.g., Japanese Unexamined Patent Application Publication No. 2015-46858). The impedance matching circuit between stages, described in Japanese Unexamined Patent Application Publication No. 2015-46858, includes one shunt inductor connected to the input terminal of an amplifier circuit.

The inductance of the shunt inductor is determined by the input impedance of the amplifier circuit. When the input impedance of the amplifier circuit is small, the inductance of the shunt inductor needs to be reduced. Therefore, for example, manufacturing variations often lead to increased variation in the inductance of the shunt inductor. When such variation in inductance increases, frequency changes tend to cause an impedance mismatch.

BRIEF SUMMARY

The present disclosure provides a semiconductor device in which manufacturing variations and frequency changes are less likely to cause an impedance mismatch.

Embodiments of the present disclosure provide a semiconductor device that includes a ground pad on a substrate, a plurality of transistors in a first direction on a surface of the substrate and each grounded at an emitter thereof, an input line on the substrate and connected to bases of the transistors, and at least two shunt inductors each connected at one end thereof to the input line and connected at the other end thereof to the ground pad. In the first direction, the at least two shunt inductors are on opposite sides of a center of a region where the transistors are.

Since two shunt inductors are connected in parallel, the inductance of each shunt inductor can be increased to achieve a desired inductance. This reduces variation in the inductance of the shunt inductor. Therefore, frequency changes are less likely to cause an impedance mismatch.

Other features, elements, characteristics and advantages of the present disclosure will become more apparent from the following detailed description of embodiments of the present disclosure with reference to the attached drawings.

DETAILED DESCRIPTION

First Embodiment

A semiconductor device according to a first embodiment will now be described with reference to FIGS. 1 to 4.

Figure 1:
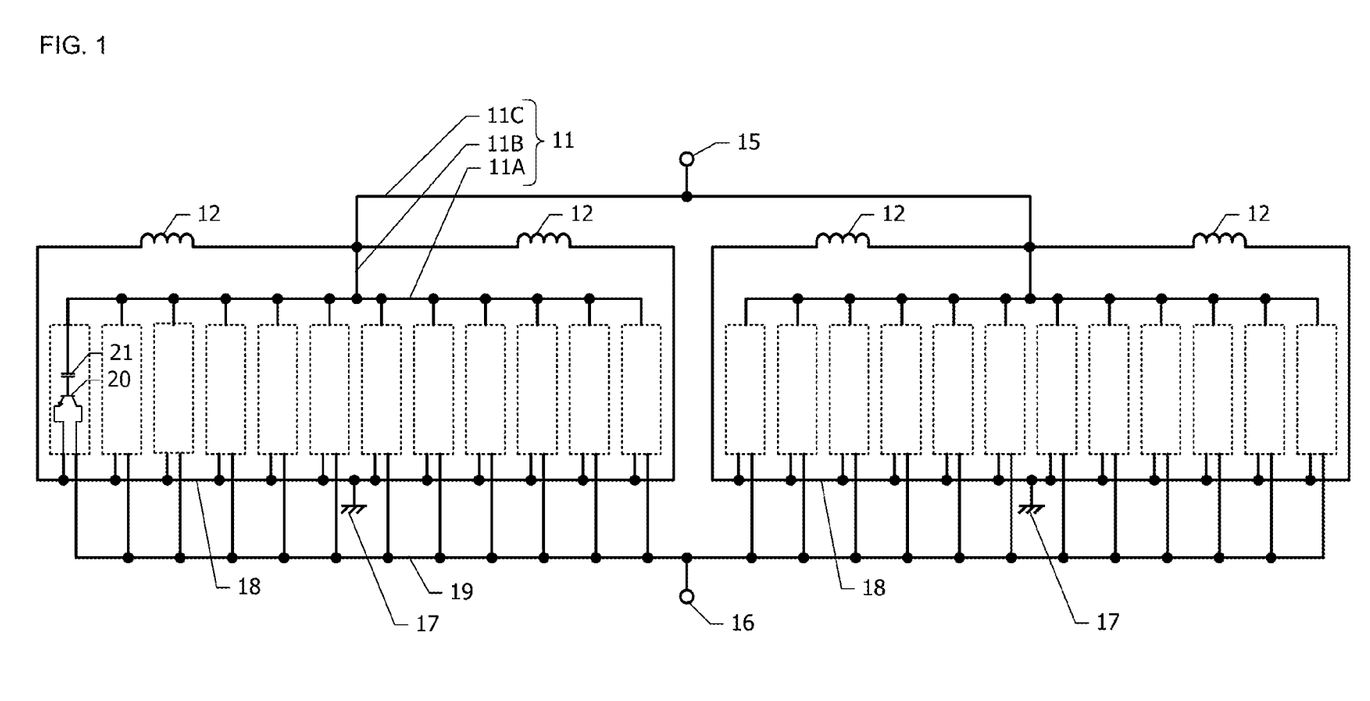
FIG. 1 is an equivalent circuit diagram of a semiconductor device according to a first embodiment.

FIG. 1 is an equivalent circuit diagram of the semiconductor device according to the first embodiment. The semiconductor device according to the first embodiment includes a plurality of transistors 20, which are divided into two groups. Each of the groups includes, for example, about 12 transistors 20.

Figure 2:
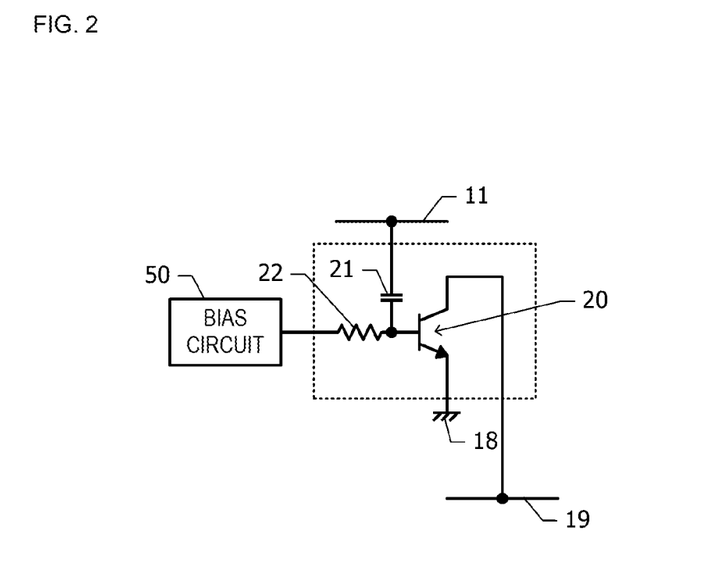
FIG. 2 is an equivalent circuit diagram illustrating a connection configuration of a collector, a base, and an emitter of one transistor of the semiconductor device according to the first embodiment.

FIG. 2 is an equivalent circuit diagram illustrating a connection configuration of a collector, a base, and an emitter of one transistor 20. The transistor 20 is, for example, a heterojunction bipolar transistor. The base of the transistor 20 is connected through an input capacitor 21 to an input line 11, and is also connected through a ballast resistance element 22 to a bias circuit 50. The emitter of the transistor 20 is connected to a ground line 18. The ground line 18 is connected to a ground plane of, for example, a module substrate on which the semiconductor device is to be mounted. This enables the emitter of the transistor 20 to be grounded. The collector of the transistor 20 is connected to an output line 19.

As illustrated in FIG. 1, the input line 11 includes a first portion 11A provided for each group of transistors 20, a second portion 11B extended from the first portion 11A, and a third portion 11C configured to connect two second portions 11B. The third portion 11C is connected to an input node 15. The bases of transistors 20 of each group are each connected through the input capacitor 21 to the common first portion 11A of the input line 11.

The emitters of transistors 20 in each group are connected through the common ground line 18 to a ground node 17. The ground node 17 is provided for each group of transistors 20. The collectors of transistors 20 in two groups are connected through one output line 19 to one output node 16. Note that the ballast resistance element 22 (see FIG. 2) and the bias circuit 50 (see FIG. 2) are not shown in FIG. 1.

Two shunt inductors 12 are connected between the second portion 11B of the input line 11 corresponding to one group of transistors 20 and the ground node 17 provided to correspond to the one group. That is, the two shunt inductors 12 are each connected at one end thereof to the input line 11, and connected at the other end thereof to the emitters of transistors 20 in the group. As for the other group of transistors 20, two shunt inductors 12 are connected in the same manner as that described above.

A radio frequency signal is received as input through the input node 15. The transistors 20 form a radio frequency amplifier that amplifies the radio frequency signal received as input through the input node 15 and outputs the amplified radio frequency signal through the output node 16. The shunt inductors 12 form an impedance matching circuit.

Figure 3:
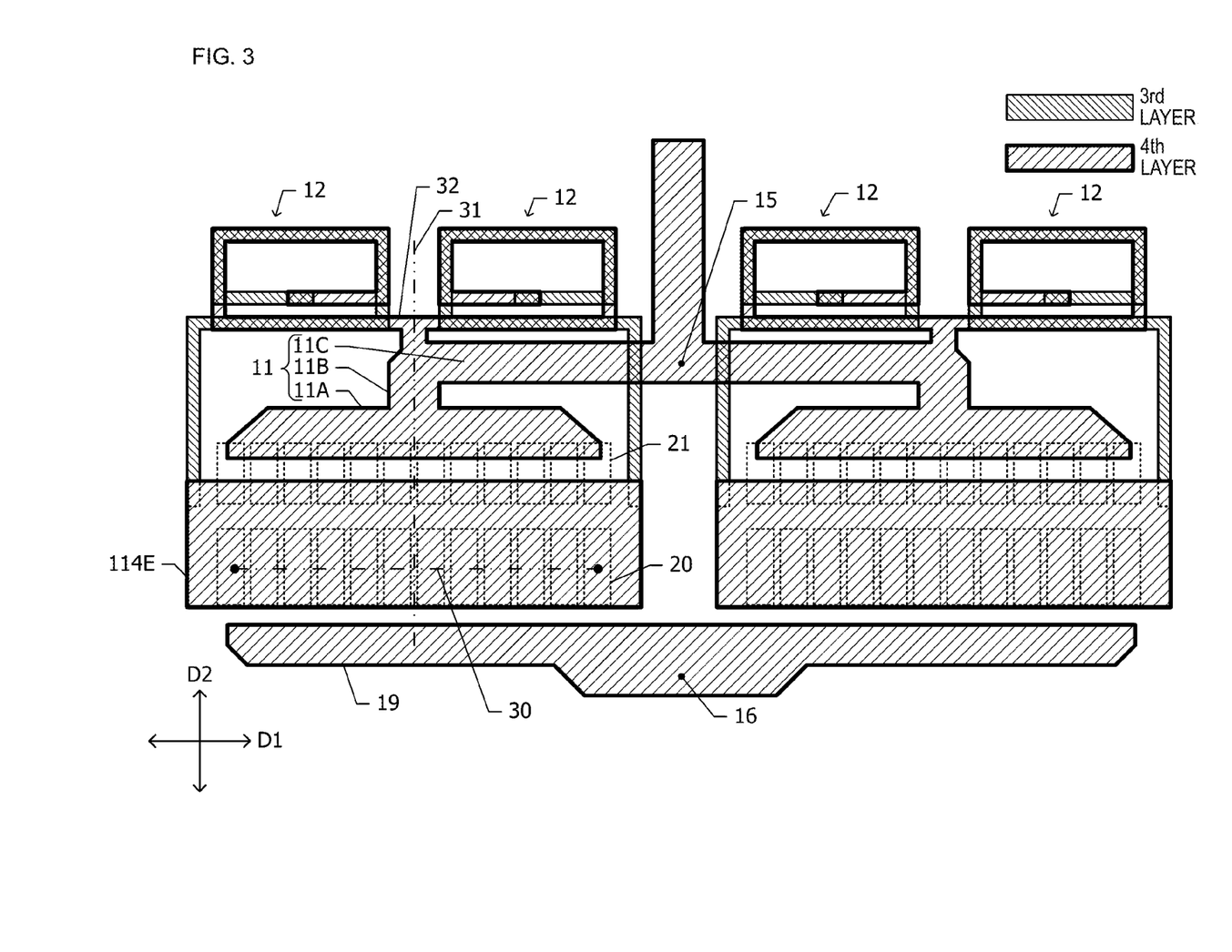
FIG. 3 is a diagram illustrating a planar positional relation of components of the semiconductor device according to the first embodiment.
Figure 4:
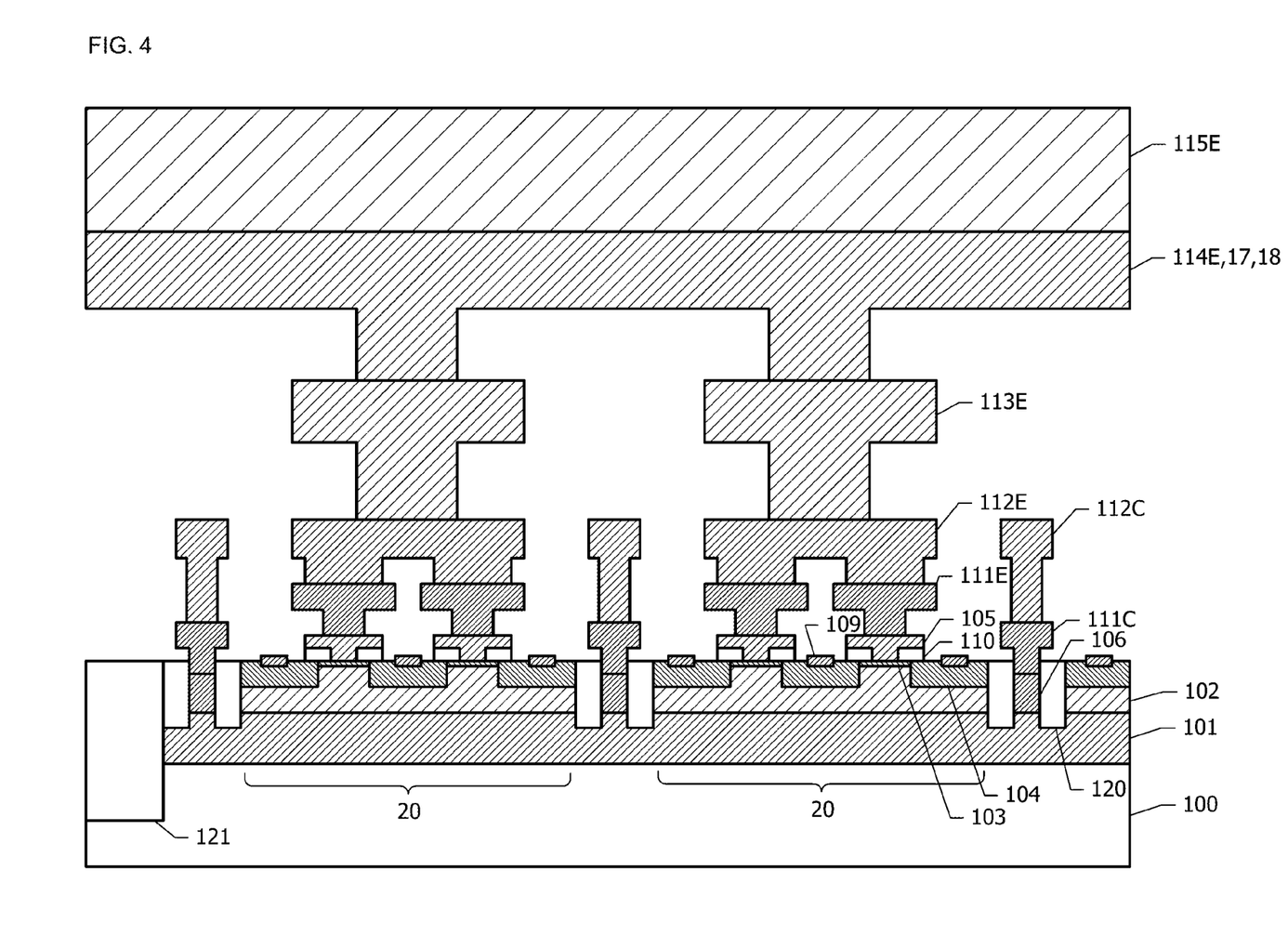
FIG. 4 is a cross-sectional view of two transistors and their vicinity in the semiconductor device according to the first embodiment.

FIG. 3 is a diagram illustrating a planar positional relation of components of the semiconductor device according to the first embodiment. FIG. 4 is a cross-sectional view of two transistors 20 and their vicinity in the semiconductor device according to the first embodiment.

A cross-sectional structure of the semiconductor device will now be described with reference to FIG. 4. A heavily doped n-type Si sub-collector layer 101 is on the surface of a p-type Si substrate 100, and an n-type Si collector layer 102 is on the sub-collector layer 101. Epitaxially grown p-type SiGe base layers 103 are on the collector layer 102.

There is a shallow trench isolation structure 120, which reaches slightly deeper than the upper surface of the sub-collector layer 101. The shallow trench isolation structure 120 defines a plurality of active regions, each having a transistor 20 therein. A deep shallow trench isolation structure 121 that reaches the bottom of the sub-collector layer 101 isolates the transistors 20 from circuits therearound. Each of the active regions surrounded by the shallow trench isolation structure 120 corresponds to a region occupied by one transistor 20 in plan view. A region surrounded by the deep shallow trench isolation structure 121 corresponds to each group of transistors 20.

A heavily doped p-type external base layer 104 is in part of the surface portion in each active region. The external base layer 104 surrounds the p-type SiGe base layers 103 in plan view. Two base layers 103 are in each active region. That is, each of the transistors 20 includes two base layers 103.

An insulating film 110 made of, for example, oxide silicon is on each of the base layers 103, and an emitter layer 105 made of, for example, n-type polysilicon is on the insulating film 110. The emitter layer 105 is in contact with the base layer 103 through an opening in the insulating film 110. An emitter current flows in the direction of thickness through a heterojunction interface between the emitter layer 105 and the base layer 103.

base electrode 109 is on the surface of the external base layer 104. For example, the base electrode 109 is made of a metal silicide, such as Ti silicide or Ni silicide. The base electrode 109 is connected to the input line 11 (see FIG. 1) in a region not shown in the cross section of FIG. 4.

A first wiring layer of, for example, Al is on the emitter layer 105, the external base layer 104, and the base electrode 109. The first wiring layer includes an emitter line 111E and a collector line 111C. The emitter line 111E in the first layer corresponds to the emitter layer 105 and is electrically connected to the emitter layer 105. The collector line 111C in the first layer is electrically connected to the collector layer 102 through a heavily doped n-type region 106 and the sub-collector layer 101.

A second wiring layer of, for example, Al is on the first wiring layer. The second wiring layer includes an emitter line 112E and a collector line 112C. The emitter line 112E is electrically connected to the emitter line 111E in the first layer and configured to electrically connect two emitter layers 105 of each of the transistors 20. The collector line 112C in the second layer is electrically connected to the collector line 111C in the first layer.

A third wiring layer of, for example, Cu is on the second wiring layer. The third wiring layer includes an emitter line 113E. The emitter line 113E is connected to the emitter line 112E in the second layer.

A fourth wiring layer of, for example, Al is on the third wiring layer. The fourth wiring layer includes an emitter pad 114E. The emitter pad 114E corresponds to the ground node 17 (see FIG. 1) and the ground line 18 (see FIG. 1) in the equivalent circuit diagram. An emitter bump 115E is on the emitter pad 114E. With the semiconductor device mounted on the module substrate, the emitter bump 115E is connected to a ground land on the module substrate. That is, the emitter pad 114E is used as a ground pad.

While not shown in the cross section of FIG. 4, the output line 19 and the output node 16 in the equivalent circuit diagram (see FIG. 1) are in the second to fourth wiring layers. Additionally, the lower electrode of the input capacitor 21 (see FIG. 2) is in the second wiring layer, and the upper electrode of the input capacitor 21 (see FIG. 2) is between the second and third wiring layers. This upper electrode is connected to the input line 11 (see FIG. 1) that is in the third wiring layer.

A planar arrangement will now be described with reference to FIG. 3. FIG. 3 illustrates conductor patterns mainly in the third and fourth wiring layers. The conductor pattern in the third layer is densely hatched from top left to bottom right, and the conductor pattern in the fourth layer is less densely hatched from top right to bottom left.

A plurality of transistors 20 (e.g., about 12 transistors 20) are in the horizontal direction (hereinafter referred to as "first direction D1") in FIG. 3. A plurality of transistors 20 belonging to one group and a plurality of transistors 20 belonging to the other group are along the same straight line. Within each group, the transistors 20 are regularly, for example, at equal distances. The regularity of the arrangement of transistors 20 is interrupted between the two groups. For example, the distance between the closest transistors 20 of the respective groups is greater than the distance between adjacent ones of the transistors 20 within each group.

The arrangement of conductor patterns relating to the transistors 20 belonging to one group illustrated in FIG. 3 will now be described. The arrangement of conductor patterns relating to the transistors 20 belonging to the other group is the same as the arrangement of conductor patterns relating to the transistors 20 belonging to the one group.

Each transistor 20 and the input capacitor 21 connected thereto are in a second direction D2 orthogonal to the first direction D1. Like the transistors 20, the input capacitors 21 are in the first direction D1.

The first portion 11A of the input line 11 in the fourth layer extends in the first direction D1 and overlaps part of each of the input capacitors 21. The bases of the transistors 20 are connected through the input capacitors 21 to the first portion 11A. A perpendicular bisector 31 to a line segment 30 intersects the first portion 11A. As in FIG. 3, the line segment 30 has, at both ends thereof, geometric centers of two transistors 20 located at both ends of each group in plan view. From the point where the perpendicular bisector 31 intersects the first portion 11A, the second portion 11B of the input line 11 is extended in the second direction D2. The geometric center of each transistor 20 in plan view corresponds to the geometric center of the active region surrounded by the shallow trench isolation structure 120 (see FIG. 4) surrounding the transistor 20.

Two shunt inductors 12 are on opposite sides of the center of the region where the transistors 20 in each group are in the first direction D1. In other words, the two shunt inductors 12 are on both sides of the perpendicular bisector 31. The center of the region where the transistors 20 in each group are in the first direction D1 is defined as the midpoint of the line segment 30 that has, at both ends thereof, geometric centers of the transistors 20 located at both ends of the group in plan view. In the second direction D2, the two shunt inductors 12 are farther from the transistors 20 than the first portion 11A of the input line 11 is. In other words, in the second direction D2, the first portion 11A of the input line 11 is between the region where the transistors 20 are and the region where the two shunt inductors 12 are.

The emitter pad 114E in the fourth layer overlaps the transistors 20. The two shunt inductors 12 each includes a conductor pattern in the third layer and a conductor pattern in the fourth layer. The conductor patterns in the third and fourth layers each forms a coil of about one turn. The conductor pattern in the third layer and the conductor pattern in the fourth layer are connected in series to form each shunt inductor 12 of about two turns. The shunt inductor 12 is connected at one end portion thereof to the second portion 11B of the input line 11 through an inductor connecting line 32. That is, the two shunt inductors 12 are connected to the input line 11 at a position on the perpendicular bisector 31. The other end portion of each shunt inductor 12 is connected to the emitter pad 114E.

The two shunt inductors 12 are positioned relative to each other to at least partially overlap if folded along the perpendicular bisector 31. For example, the two shunt inductors 12 are substantially line-symmetric with respect to the perpendicular bisector 31. More specifically, the conductor pattern of one shunt inductor 12 and the conductor pattern of the other shunt inductor 12 are substantially line-symmetric with respect to the perpendicular bisector 31. The term "substantially" means to tolerate deviation from line symmetry resulting from manufacturing variations. For example, if deviation from ideal line-symmetric patterns is tolerable pattern deformation or positional displacement which may be caused by manufacturing variations, two patterns can be regarded as being "substantially line-symmetric".

The second portion 11B corresponding to one group of transistors 20 and the second portion 11B corresponding to the other group of transistors 20 are connected by the third portion 11C. The point at which the third portion 11C is divided into two equal parts in the first direction D1 corresponds to the input node 15 in the equivalent circuit diagram (see FIG. 1).

The output line 19 that includes the conductor pattern in the fourth layer is opposite to the input line 11 as viewed from the region where the transistors 20 are. In the first direction D1, the output line 19 extends from one group of transistors 20 to the other. The output line 19 is also in the third and second conductor layers. The conductor pattern corresponding to the output line 19 in the third and second conductor layers is for each group of transistors 20.

A point at which the output line 19 is divided into two equal parts in the first direction D1 corresponds to the output node 16 in the equivalent circuit diagram (see FIG. 1). Specifically, an output bump connected to the output line 19 is at the point corresponding to the output node 16.

Advantageous effects of the first embodiment will now be described with reference to a comparative example illustrated in FIG. 5.

Figure 5:
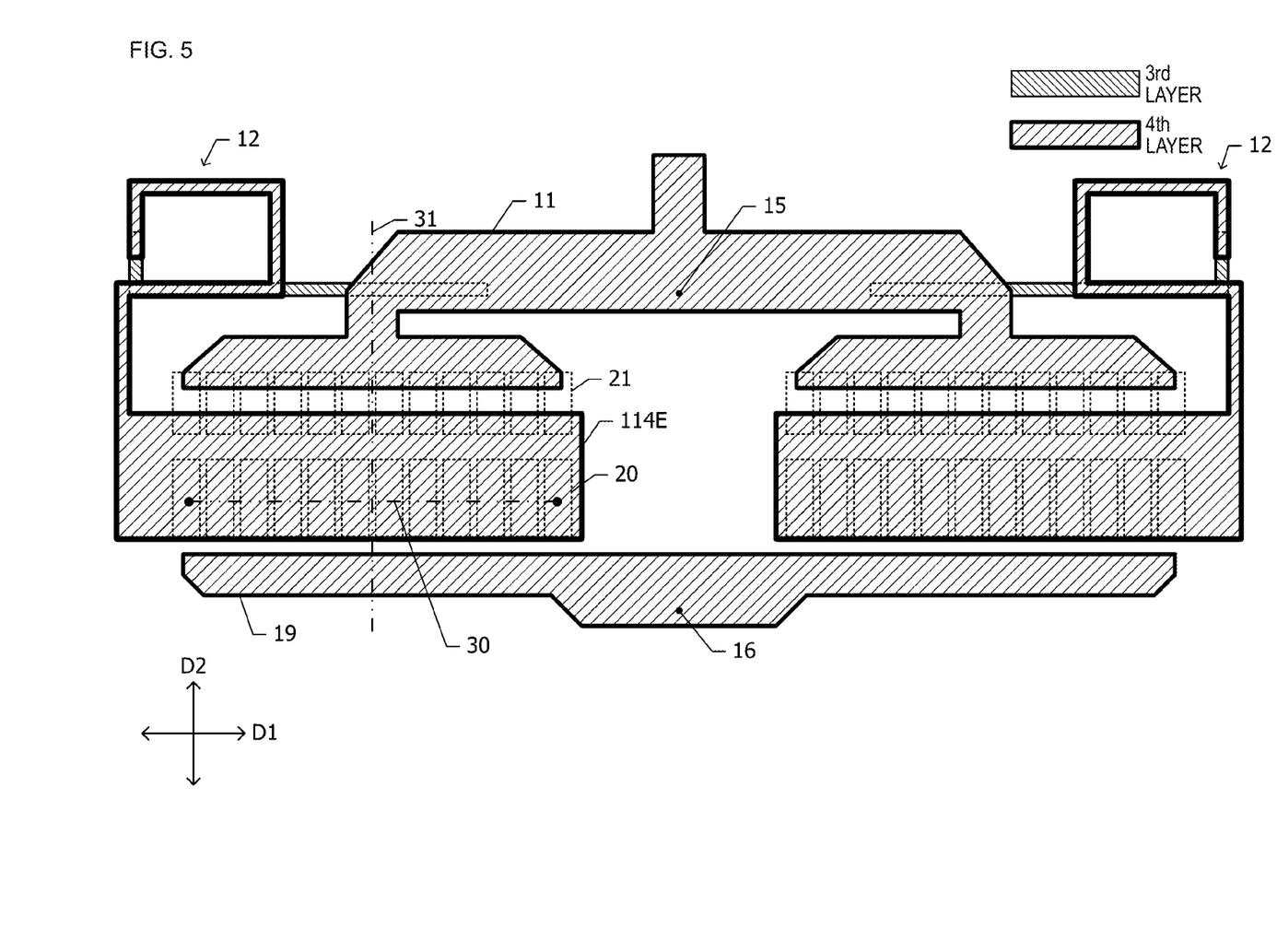
FIG. 5 is a diagram illustrating a planar positional relation of components of a semiconductor device according to a comparative example.

FIG. 5 is a diagram illustrating a planar positional relation of components of a semiconductor device according to the comparative example. In the first embodiment described above, two shunt inductors 12 are provided to correspond to a plurality of transistors 20 belonging to one group. In the comparative example illustrated in FIG. 5, on the other hand, one shunt inductor 12 is provided to correspond to a plurality of transistors 20 belonging to one group. In the first direction D1, the one shunt inductor 12 is on only one side of the center of the region where the transistors 20 are.

Since the input impedance of the transistors 20, which are heterojunction bipolar transistors, is small, the inductance of the shunt inductor 12 for impedance matching is required to be small (e.g., about 0.1 nH or less). In the comparative example, where the inductance of one shunt inductor 12 needs to be small, variation in the inductance of the shunt inductor 12 tends to increase. As a result, changes in the frequency of an input radio frequency signal are more likely to cause an impedance mismatch.

In the first embodiment, on the other hand, where two shunt inductors 12 are connected in parallel, the inductance of each shunt inductor 12 is substantially double that in the comparative example. Increasing the inductance of the shunt inductor 12 reduces the impact of variation in inductance. This makes it less likely that changes in the frequency of an input radio frequency signal would cause an impedance mismatch.

In the first embodiment, two shunt inductors 12 are symmetrically in the first direction D1, with respect to the region where a plurality of transistors 20 in each group are. This makes the degree of operational imbalance among the transistors 20 lower than that in the comparative example. Additionally, in the first embodiment, two shunt inductors 12 are substantially line-symmetric with respect to the perpendicular bisector 31. This can further reduce the degree of imbalance among the transistors 20.

Modifications of the first embodiment will now be described. Although each of the shunt inductors 12 has about two turns in the first embodiment, the number of turns may be either increased or decreased where necessary. To increase the number of turns, the conductor pattern in each wiring layer may be in a substantially spiral shape.

Although Si and SiGe heterojunction bipolar transistors (HBTs) are employed as the transistors 20 in the first embodiment, other compound semiconductor HBTs may be employed instead. For example, HBTs with a GaAs base, a GaAs collector, and an InGaP emitter may be employed. The HBTs have, for example, a mesa structure on a GaAs substrate, and the mesa structure includes a collector layer, a base layer, and an emitter layer. When each of the transistors 20 has a mesa structure, the geometric center of the mesa structure may be employed as the geometric center of the transistor 20 in plan view.

In the first embodiment, two shunt inductors 12 are connected through the emitter pad 114E to the emitters of the transistors 20. The emitter pad 114E is connected to the ground land on the module substrate, with the emitter bump 115E (see FIG. 4) interposed therebetween. That is, one end portion of each shunt inductor 12 is grounded through the emitter pad 114E. As a modification of the first embodiment, one end portion of each shunt inductor 12 may be connected to a ground pad different from the emitter pad 114E. In this case, two shunt inductors 12 are connected to the emitters of the transistors 20 through the ground land and the ground plane of the module substrate on which the semiconductor device is to be mounted.

Although bipolar transistors are used as the transistors 20 in the first embodiment, field effect transistors (FETs) may be used instead of the bipolar transistors. When FETs are used as the transistors 20, the collector, base, and emitter of each bipolar transistor can translate into drain, gate, and source, respectively.

Although two shunt inductors 12 are connected for each group of transistors 20 in the first embodiment, three or more shunt inductors may be connected for each group.

Second Embodiment

A semiconductor device according to a second embodiment will now be described with reference to FIG. 6. The description of the same components as those of the semiconductor device according to the first embodiment (see FIGS. 1 to 4) will be omitted.

Figure 6:
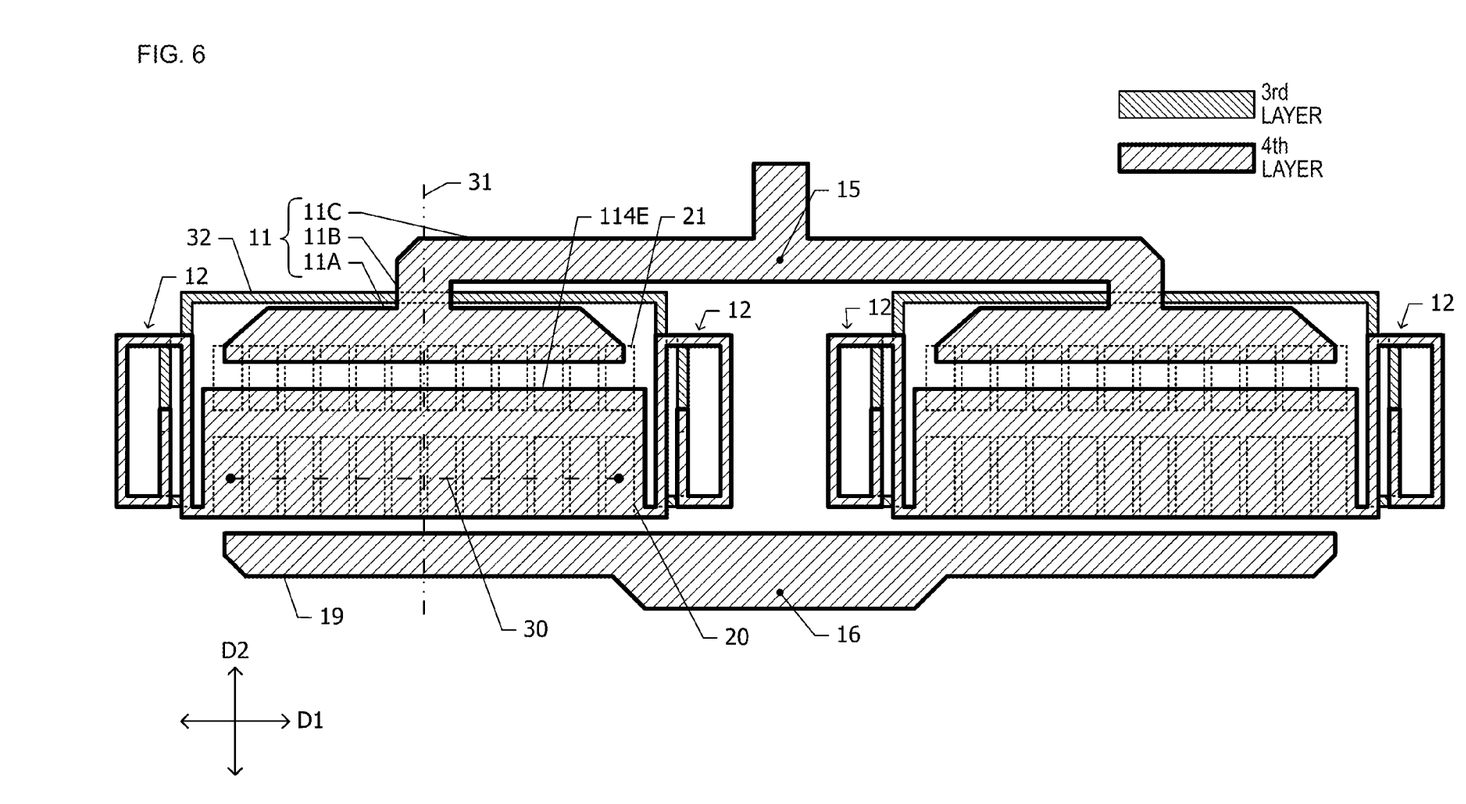
FIG. 6 is a diagram illustrating a planar positional relation of components of a semiconductor device according to a second embodiment.

FIG. 6 is a diagram illustrating a planar positional relation of components of the semiconductor device according to the second embodiment. In FIG. 6, as in the case of FIG. 3, the conductor pattern in the third layer is densely hatched from top left to bottom right, and the conductor pattern in the fourth layer is less densely hatched from top right to bottom left.

In the semiconductor device of the first embodiment (see FIG. 3), two shunt inductors 12 are farther from the region where the transistors 20 are than the first portion 11A of the input line 11 is. In the second embodiment, on the other hand, two shunt inductors 12 are with the transistors 20 belonging to each group interposed therebetween in the first direction D1.

As in the case of the first embodiment, the two shunt inductors 12 are on both sides of the perpendicular bisector 31. The conductor patterns forming the two shunt inductors 12 are substantially line-symmetric with respect to the perpendicular bisector 31.

Of the conductor patterns in the third and fourth layers forming each shunt inductor 12 in the first embodiment (see FIG. 3), the conductor pattern in the fourth layer is connected to the input line 11 and the conductor pattern in the third layer is connected to the emitter pad 114E. In the second embodiment, on the other hand, the conductor pattern in the third layer of the shunt inductor 12 is connected through the inductor connecting line 32 to the input line 11, and the conductor pattern in the fourth layer is connected to the emitter pad 114E.

Advantageous effects of the second embodiment will now be described.

As in the first embodiment, the second embodiment provides an advantageous effect of making it less likely that changes in the frequency of an input radio frequency signal would cause an impedance mismatch. Also, as in the first embodiment, the second embodiment provides an advantageous effect of improving operational balance among the transistors 20. Additionally, in the second embodiment, the shunt inductors 12 are not present in the second direction D2, as viewed from the region where the transistors 20 are. This makes the size of the region occupied by the transistors 20 and the shunt inductors 12 in the second direction D2 smaller than that in the first embodiment. Conversely, the first embodiment can reduce the size of the region occupied by the transistors 20 and the shunt inductors 12 in the first direction D1.

Modifications of the second embodiment will now be described.

In the second embodiment, the conductor pattern in the third layer of each shunt inductor 12 is connected to the input line 11, and the conductor pattern in the fourth layer is connected to the emitter pad 114E. As in the case of the first embodiment, however, the conductor pattern in the fourth layer may be connected to the input line 11 and the conductor pattern in the third layer may be connected to the emitter pad 114E. As another modification of the second embodiment, the conductor patterns in the third and fourth layers of each shunt inductor 12 of the first embodiment may be connected to the input line 11 and the emitter pad 114E, respectively.

Third Embodiment

A semiconductor device according to a third embodiment will now be described with reference to FIG. 7. The description of the same components as those of the semiconductor device according to the second embodiment (see FIG. 6) will be omitted.

Figure 7:
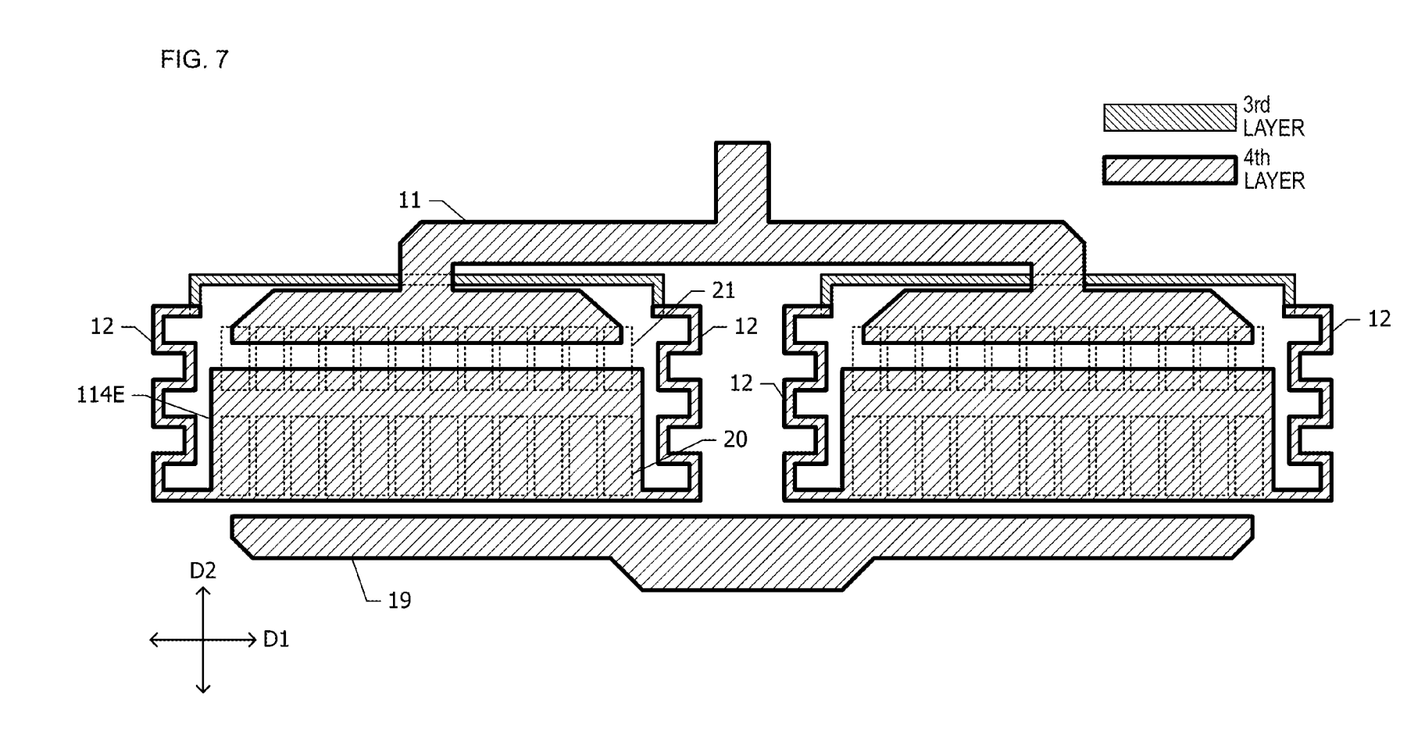
FIG. 7 is a diagram illustrating a planar positional relation of components of a semiconductor device according to a third embodiment.

FIG. 7 is a diagram illustrating a planar positional relation of components of the semiconductor device according to the third embodiment. In FIG. 7, as in the case of FIG. 6, the conductor pattern in the third layer is densely hatched from top left to bottom right, and the conductor pattern in the fourth layer is less densely hatched from top right to bottom left.

In the semiconductor device of the second embodiment (see FIG. 6), each of the shunt inductors 12 is a coil of about two turns. In the third embodiment, on the other hand, each of the shunt inductors 12 is a substantially meandering conductor pattern in plan view.

Advantageous effects of the third embodiment will now be described. As in the second embodiment, the third embodiment provides an advantageous effect of making it less likely that changes in the frequency of an input radio frequency signal would cause an impedance mismatch. Also, as in the second embodiment, the third embodiment provides an advantageous effect of improving operational balance among the transistors 20.

The inductance of an inductor that includes a substantially meandering conductor pattern is typically smaller than the inductance of a substantially coil-shaped (helical) or spiral conductor pattern. The shape of the shunt inductors 12 (e.g., coil shape, meandering shape, spiral shape, or combination of these shapes) may be selected in accordance with the inductance required for the shunt inductors 12.

A modification of the third embodiment will now be described.

In the third embodiment, as in the second embodiment, two shunt inductors 12 are arranged with a plurality of transistors 20 interposed therebetween in the first direction D1 (see FIG. 7). As the modification of the third embodiment, the shunt inductors 12 having a substantially meandering shape may be at the same positions as those of the shunt inductors 12 of the semiconductor device according to the first embodiment (see FIG. 6).

Fourth Embodiment

A semiconductor device according to a fourth embodiment will now be described with reference to FIGS. 8 and 9. The description of the same components as those of the semiconductor device according to the first embodiment (see FIGS. 1 to 4) will be omitted.

Figure 8:
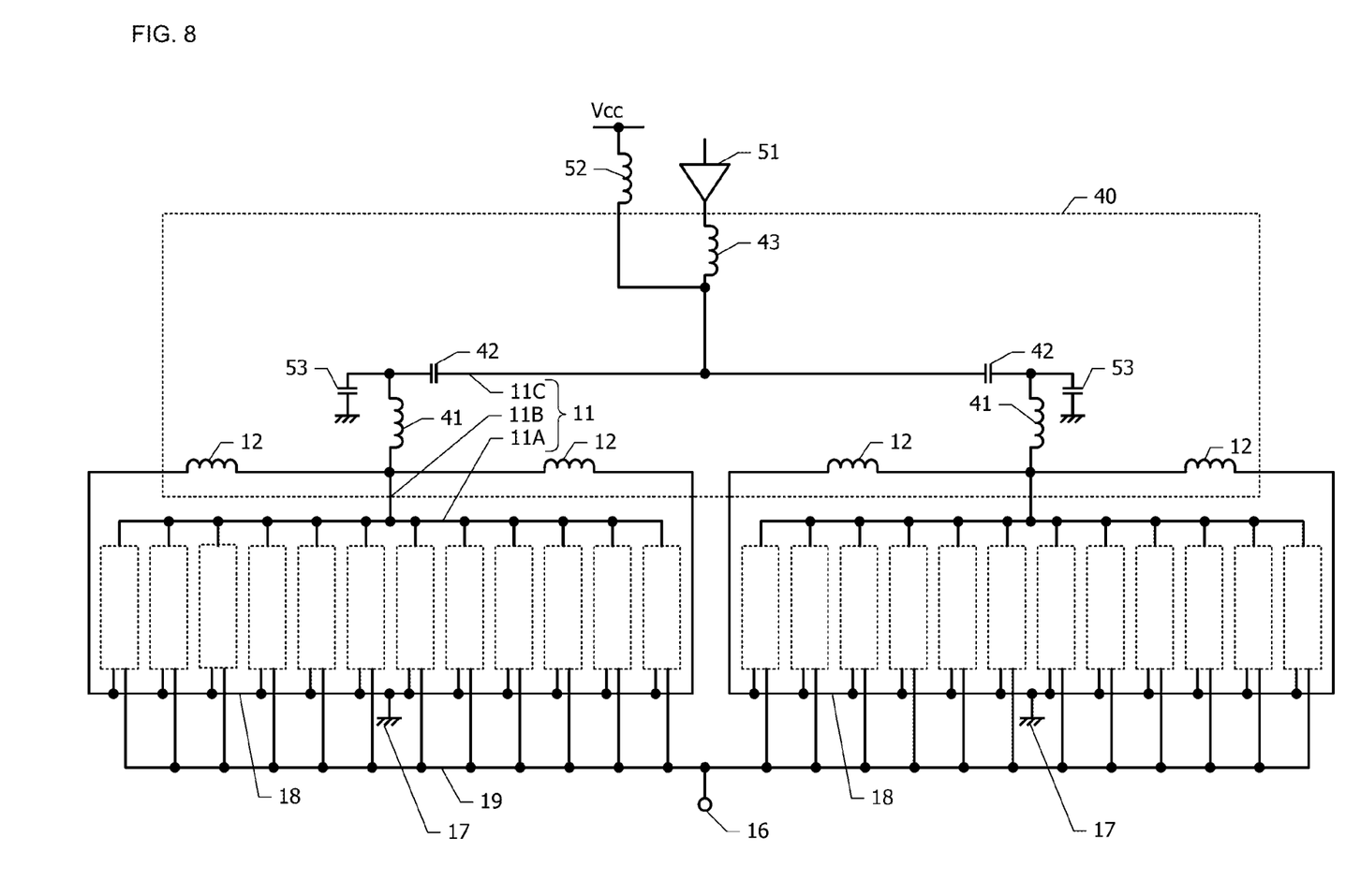
FIG. 8 is an equivalent circuit diagram of a semiconductor device according to a fourth embodiment.

FIG. 8 is an equivalent circuit diagram of the semiconductor device according to the fourth embodiment. In the first embodiment described above, the impedance matching circuit includes the shunt inductors 12 (see FIG. 1) as circuit elements. In the fourth embodiment, on the other hand, an impedance matching circuit 40 includes two series inductors 41, two shunt capacitors 53, two capacitors 42, and one series inductor 43, in addition to the shunt inductors 12.

In the first embodiment, the first portion 11A of the input line 11 provided for each group of transistors 20 is directly connected through the second portion 11B and the third portion 11C to the first portion 11A for another group of transistors 20. In the fourth embodiment, on the other hand, the first portion 11A provided for each group of transistors 20 is connected through the series inductor 41 and the capacitor 42 to the third portion 11C. The point of connection between the series inductor 41 and the capacitor 42 is grounded through the shunt capacitor 53. The third portion 11C of the input line 11 is connected through the series inductor 43 to the output terminal of an amplifier circuit 51 in the previous stage.

A supply voltage Vcc is applied between the third portion 11C and the series inductor 43, through a choke inductor 52. Power is supplied to the amplifier circuit 51 through the choke inductor 52 and the series inductor 43.

Figure 9:
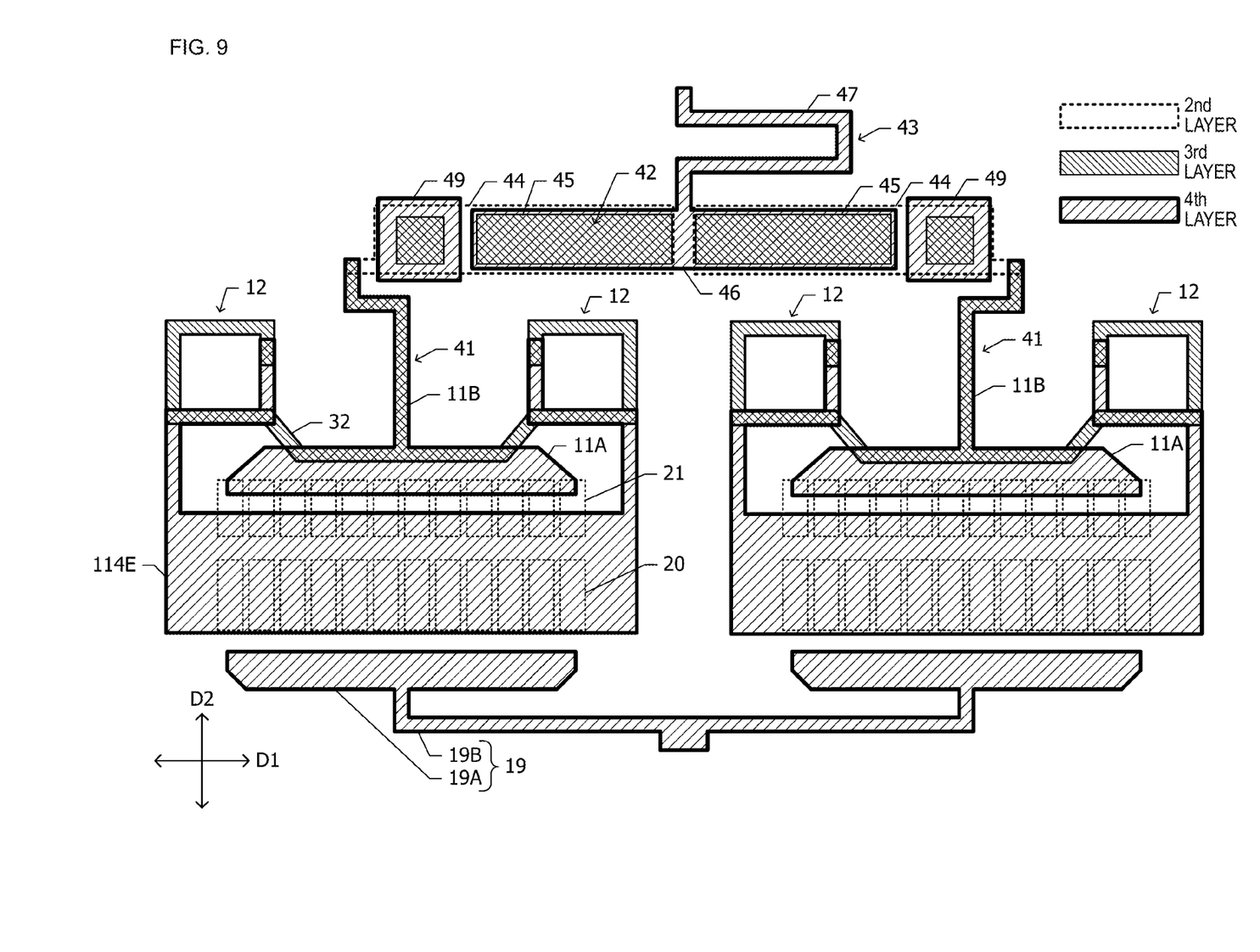
FIG. 9 is a diagram illustrating a planar positional relation of components of the semiconductor device according to the fourth embodiment.

FIG. 9 is a diagram illustrating a planar positional relation of components of the semiconductor device according to the fourth embodiment. In FIG. 9, as in the case of FIG. 3, the conductor pattern in the third layer is densely hatched from top left to bottom right, and the conductor pattern in the fourth layer is less densely hatched from top right to bottom left. Additionally, the conductor pattern in the second layer is indicated by a broken line.

The positional relation between the shunt inductors 12 and the transistors 20 is the same as that in the semiconductor device according to the first embodiment. In the first embodiment, the inductor connecting line 32 (see FIG. 3) intersects the second portion 11B of the input line 11 and connects to the second portion 11B at the intersection. In the fourth embodiment, on the other hand, the inductor connecting line 32 partially overlaps part of the first portion 11A of the input line 11. The region where the inductor connecting line 32 and the first portion 11A of the input line 11 overlap has a band-like shape elongated in the first direction D1. The inductor connecting line 32 and the first portion 11A of the input line 11 are connected in the region where they overlap.

The second portion 11B of the input line 11 is extended in the second direction D2 from the point where the first portion 11A is divided into two equal parts in the first direction D1. A conductor pattern in the third wiring layer overlaps the second portion 11B in plan view. This conductor pattern branches off the inductor connecting line 32. The inductance of the second portion 11B corresponds to the series inductor 41 in the equivalent circuit diagram (see FIG. 8).

Two second portions 11B, each corresponding to one group of transistors 20, are connected to respective conductor patterns 44 in the second wiring layer. Two conductor patterns 45 in the third layer overlap the respective conductor patterns 44 in the second layer. The conductor patterns 44 in the second layer are connected to the respective conductor patterns 45 in the third layer.

A conductor pattern 46 in the fourth layer overlaps both the two conductor patterns 45 in the third layer. The conductor patterns 45 in the third layer, the conductor pattern 46 in the fourth layer, and an insulating film between the conductor patterns 45 and the conductor pattern 46 form the capacitors 42 in the equivalent circuit diagram (see FIG. 8). A conductor pattern 47 is extended from the conductor pattern 46. The inductance of the conductor pattern 47 corresponds to the series inductor 43 in the equivalent circuit diagram (see FIG. 8).

Two conductor patterns 49 in the fourth layer overlap respective conductor patterns 48 in the third layer. The conductor patterns 49 in the fourth layer are used as ground pads. The conductor patterns 48 and 49 form the shunt capacitors 53 (see FIG. 8).

In the first embodiment, one output line 19 extends from one group of transistors 20 to the other in the first direction D1. In the fourth embodiment, on the other hand, a first portion 19A of the output line 19 is provided for each group of transistors 20, and the two first portions 19A are connected by a second portion 19B. The first portions 19A are each connected to the second portion 19B at the point where the first portion 19A is divided into two equal parts in the first direction D1.

Advantageous effects of the fourth embodiment will now be described. As in the first embodiment, the fourth embodiment provides an advantageous effect of making it less likely that changes in the frequency of a radio frequency signal received as input from the amplifier circuit 51 in the previous stage would cause an impedance mismatch. Also, as in the first embodiment, the fourth embodiment provides an advantageous effect of improving operational balance among the transistors 20. Note that inductors described in the first to fourth embodiments are defined to correspond to all the regions where substantially spiral or meandering inductors are.

The embodiments described above are merely examples, and some of the components described in different embodiments may be either replaced or combined. The same operation and advantageous effect achieved by the same configuration in different embodiments will not be mentioned one by one in each embodiment. The present disclosure is not limited to the embodiments described above. For example, it is obvious to those skilled in the art that various changes, modifications, and combinations are possible.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A semiconductor device comprising:
    a ground pad on a substrate;
    a plurality of transistors arranged in a first direction on a surface of the substrate, an emitter of each transistor being grounded;
    an input line on the substrate, the input line being connected to a base of each transistor; and
    at least two shunt inductors, each shunt inductor being connected at a first end to the input line and at a second end to the ground pad,
    wherein a first of the at least two shunt inductors is on a first side of a region of the substrate in which the plurality of transistors are arranged, with respect to the first direction, and
    wherein a second of the at least two shunt inductors is on a second side of the region of the substrate in which the plurality of transistors are arranged, with respect to the first direction, the second side being opposite the first side.

2. The semiconductor device according to claim 1, wherein the emitter of each transistors is connected to the ground pad.

3. The semiconductor device according to claim 2, wherein at least one of the transistors is between the first shunt inductor and the second shunt inductor in the first direction.

4. The semiconductor device according to claim 2, wherein, as seen in a plan view of the substrate, the first and second shunt inductors at least partially overlap if the substrate were folded along a perpendicular bisector, the perpendicular bisector bisecting a line segment extending in the first direction from a geometric center of a first end transistor of the plurality of transistors to a geometric center of a second end transistor of the plurality of transistors.

5. The semiconductor device according to claim 1, wherein the input line and the at least two shunt inductors are on the same side of the substrate with respect to a second direction, the second direction being orthogonal to the first direction.

6. The semiconductor device according to claim 5, wherein, as seen in a plan view of the substrate, the first and second shunt inductors at least partially overlap if the substrate were folded along a perpendicular bisector, the perpendicular bisector bisecting a line segment extending in the first direction from a geometric center of a first end transistor of the plurality of transistors to a geometric center of a second end transistor of the plurality of transistors.

7. The semiconductor device according to claim 1, wherein at least one of the transistors is between the first shunt inductor and the second shunt inductor in the first direction.

8. The semiconductor device according to claim 7, wherein, as seen in a plan view of the substrate, the first and second shunt inductors at least partially overlap if the substrate were folded along a perpendicular bisector, the perpendicular bisector bisecting a line segment extending in the first direction from a geometric center of a first end transistor of the plurality of transistors to a geometric center of a second end transistor of the plurality of transistors.

9. The semiconductor device according to claim 1, wherein, as seen in a plan view of the substrate, the first and second shunt inductors at least partially overlap if the substrate were folded along a perpendicular bisector, the perpendicular bisector bisecting a line segment extending in the first direction from a geometric center of a first end transistor of the plurality of transistors to a geometric center of a second end transistor of the plurality of transistors.

10. The semiconductor device according to claim 9, wherein the first and second shunt inductors are substantially symmetric with respect to the perpendicular bisector.

11. The semiconductor device according to claim 10, wherein the at least two shunt inductors are connected to the input line at a position on the perpendicular bisector.

12. The semiconductor device according to claim 11, wherein:
the input line comprises a first portion extending in the first direction and a second portion extending in a direction orthogonal to the first direction from a point where the first portion intersects the perpendicular bisector;
the base of each transistor is connected to the first portion; and
the at least two shunt inductors are connected to the second portion.

13. The semiconductor device according to claim 10, wherein the first and second shunt inductors are conductor patterns on the substrate, and are substantially symmetric with respect to the perpendicular bisector.

14. The semiconductor device according to claim 10, wherein:
the input line comprises a first portion extending in the first direction and a second portion extending in a direction orthogonal to the first direction from a point where the first portion intersects the perpendicular bisector;
the base of each transistor is connected to the first portion; and
the at least two shunt inductors are connected to the second portion.

15. The semiconductor device according to claim 9, wherein the at least two shunt inductors are connected to the input line at a position on the perpendicular bisector.

16. The semiconductor device according to claim 15, wherein the first and second shunt inductors are conductor patterns on the substrate, and are substantially symmetric with respect to the perpendicular bisector.

17. The semiconductor device according to claim 15, wherein:
the input line comprises a first portion extending in the first direction and a second portion extending in a direction orthogonal to the first direction from a point where the first portion intersects the perpendicular bisector;
the base of each transistor is connected to the first portion; and
the at least two shunt inductors are connected to the second portion.

18. The semiconductor device according to claim 9, wherein the first and second shunt inductors are conductor patterns on the substrate, and are substantially symmetric with respect to the perpendicular bisector.

19. The semiconductor device according to claim 18, wherein:
the input line comprises a first portion extending in the first direction and a second portion extending in a direction orthogonal to the first direction from a point where the first portion intersects the perpendicular bisector;
the base of each transistor is connected to the first portion; and
the at least two shunt inductors are connected to the second portion.

20. The semiconductor device according to claim 9, wherein:
the input line comprises a first portion extending in the first direction and a second portion extending in a direction orthogonal to the first direction from a point where the first portion intersects the perpendicular bisector;
the base of each transistor is connected to the first portion; and
the at least two shunt inductors are connected to the second portion.

* * * * *